(12) United States Patent
Huang

(10) Patent No.: US 11,728,776 B2
(45) Date of Patent: Aug. 15, 2023

(54) SWITCHED CAPACITOR AMPLIFIER APPARATUS AND SWITCHED CAPACITOR AMPLIFYING METHOD FOR IMPROVING LEVEL-SHIFTING

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/668,397

(22) Filed: Feb. 10, 2022

(65) Prior Publication Data

US 2022/0399858 A1 Dec. 15, 2022

(30) Foreign Application Priority Data

Jun. 11, 2021 (TW) .................................. 110121520

(51) Int. Cl.
*H03F 3/00* (2006.01)
*H03K 19/0175* (2006.01)

(52) U.S. Cl.
CPC ..... *H03F 3/005* (2013.01); *H03K 19/017509* (2013.01)

(58) Field of Classification Search
CPC .... H03F 3/005; H03F 1/02; H03K 19/017509
USPC ..................... 330/9, 252–261, 291
See application file for complete search history.

(56) References Cited

U.S. PATENT DOCUMENTS

| | | | |
|---|---|---|---|
| 7,629,838 B2* | 12/2009 | Lim ........................ | H03F 3/005 |
| | | | 330/9 |
| 8,198,937 B1* | 6/2012 | Vilas Boas ......... | H03F 3/45475 |
| | | | 330/258 |
| 2007/0194844 A1* | 8/2007 | Signori ................... | H03F 3/005 |
| | | | 330/9 |

* cited by examiner

*Primary Examiner* — Hieu P Nguyen
(74) *Attorney, Agent, or Firm* — WPAT, P.C

(57) ABSTRACT

The present disclosure discloses a switched capacitor amplifier apparatus for improving level-shifting. An amplifier includes input terminals and output terminals. Two capacitor circuits correspond to signal input terminals and signal output terminals and each includes a sampling capacitor circuit, a load capacitor and a level-shifting capacitor. The sampling capacitor circuit samples an input signal from one of the signal input terminals to one of the input terminals. An electrical charge neutralizing capacitor is coupled between the output terminals. The load capacitor and the level-shifting capacitor are charged according to an output from one of the output terminals in an estimation period. The level-shifting capacitor charges the load capacitor in a level-shifting period to generate an output signal at one of the signal output terminals. The electrical charge neutralizing capacitor receives and provides electrical charges from the output terminals to the level-shifting capacitor respectively in the estimation period and the level-shifting period.

10 Claims, 6 Drawing Sheets

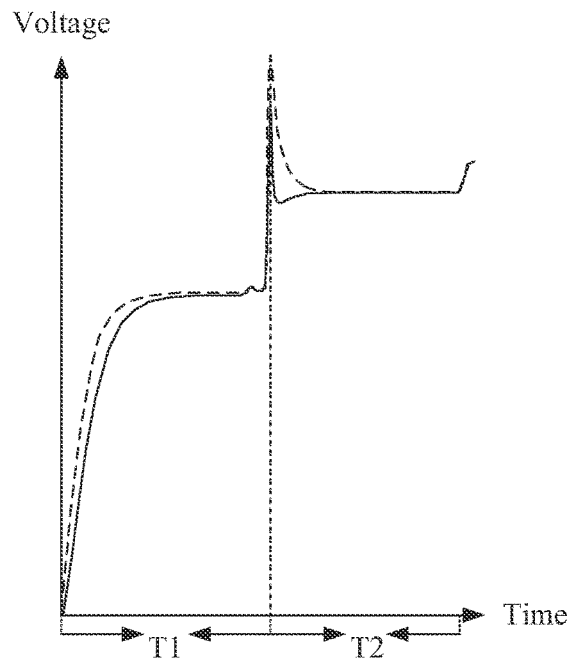

Fig. 4

Sample and output one of two input signals from one of two signal input terminals to one of two input terminals of amplifier in sampling period by sampling capacitor circuit of each of two capacitor circuits. — S510

Generate connection relations between both of load capacitor and level-shifting capacitor of one of two capacitor circuits and one of two output terminals of amplifier, such that load capacitor and level-shifting capacitor are charged according to output from one of two output terminals of amplifier in estimation period and level-shifting capacitor charges load capacitor in level-shifting period to accomplish level-shifting such that load capacitor generates one of two output signals at one of two signal output terminals — S520

Receive electrical charges from two output terminals of amplifier in estimation period and provides electrical charges to level-shifting capacitor of each of two capacitor circuits in level-shifting period by electrical charge neutralizing capacitor coupled between two output terminals of amplifier — S530

Fig. 5

SWITCHED CAPACITOR AMPLIFIER APPARATUS AND SWITCHED CAPACITOR AMPLIFYING METHOD FOR IMPROVING LEVEL-SHIFTING

BACKGROUND OF THE INVENTION

1. Field of the Invention

The present disclosure relates to a switched capacitor amplifier apparatus and a switched capacitor amplifying method for improving level-shifting.

2. Description of Related Art

In analog signal processing circuit, a gain stage circuit is required to be disposed to amplify the input analog signal. In some approaches, the switched capacitor amplifier circuit is often used to implement the gain stage circuit.

An operational amplifier and a group of capacitors are required in a switched capacitor amplifier circuit to amplify the input signal. However, when a switch operation of a capacitor circuit coupled to the output terminal of the operational amplifier is performed, a current supplying ability thereof may not be sufficient such that an output voltage of the switched capacitor amplifier circuit is unstable.

SUMMARY OF THE INVENTION

In consideration of the problem of the prior art, an object of the present disclosure is to provide a switched capacitor amplifier apparatus and a switched capacitor amplifying method for improving level-shifting.

The present invention discloses a switched capacitor amplifier apparatus for improving level-shifting that includes an amplifier, two capacitor circuits and an electrical charge neutralizing capacitor. The amplifier includes two input terminals and two output terminals. Each of the two capacitor circuits corresponds to one of two signal input terminals and one of two signal output terminals, and includes a sampling capacitor circuit, a load capacitor and a level-shifting capacitor, wherein the sampling capacitor circuit is configured to sample and output one of two input signals from one of the two signal input terminals to one of the two input terminals of the amplifier in a sampling period. The electrical charge neutralizing capacitor is coupled between the two output terminals of the amplifier. A plurality of connection relations are generated between both the load capacitor and the level-shifting capacitor and one of the two output terminals of the amplifier, such that the load capacitor and the level-shifting capacitor are charged according to an output from one of the two output terminals of the amplifier in an estimation period and the level-shifting capacitor charges the load capacitor in a level-shifting period to accomplish level-shifting such that the load capacitor generates one of two output signals at one of the signal output terminals. The electrical charge neutralizing capacitor is configured to receive electrical charges from the two output terminals of the amplifier in the estimation period and provide the electrical charges to the level-shifting capacitor of each of the two capacitor circuits in the level-shifting period.

The present invention also discloses a switched capacitor amplifying method for improving level-shifting used in a switched capacitor amplifier apparatus that includes the steps outlined below. One of two input signals is sampled from one of two signal input terminals and outputted to one of two input terminals of an amplifier in a sampling period by a sampling capacitor circuit of one of two capacitor circuits. A plurality of connection relations between both of a load capacitor and a level-shifting capacitor of one of the two capacitor circuits and one of two output terminals of the amplifier are generated, such that the load capacitor and the level-shifting capacitor are charged according to an output from one of the two output terminals of the amplifier in an estimation period and the level-shifting capacitor charges the load capacitor in a level-shifting period to accomplish level-shifting such that the load capacitor generates one of two output signals at one of two signal output terminals. Electrical charges are received from the two output terminals of the amplifier in the estimation period and the electrical charges are provided to the level-shifting capacitor of each of the two capacitor circuits in the level-shifting period by an electrical charge neutralizing capacitor coupled between the two output terminals of the amplifier.

These and other objectives of the present disclosure will no doubt become obvious to those of ordinary skill in the art after reading the following detailed description of the preferred embodiments that are illustrated in the various figures and drawings.

BRIEF DESCRIPTION OF THE DRAWINGS

FIG. 4 illustrates a voltage waveform diagram of the output terminal of the amplifier in the level-shifting period according to an embodiment of the present invention.

FIG. 5 illustrates a flow chart of a switched capacitor amplifying method for improving level-shifting according to an embodiment of the present invention.

DETAILED DESCRIPTION OF THE PREFERRED EMBODIMENTS

An aspect of the present invention is to provide a switched capacitor amplifier apparatus and a switched capacitor amplifying method for improving level-shifting that uses an electrical charge neutralizing capacitor to compensate the power supplying ability during a level-shifting period such that a voltage of a level-shifting capacitor can quickly become stable to improve the speed of level-shifting.

Figure 1:
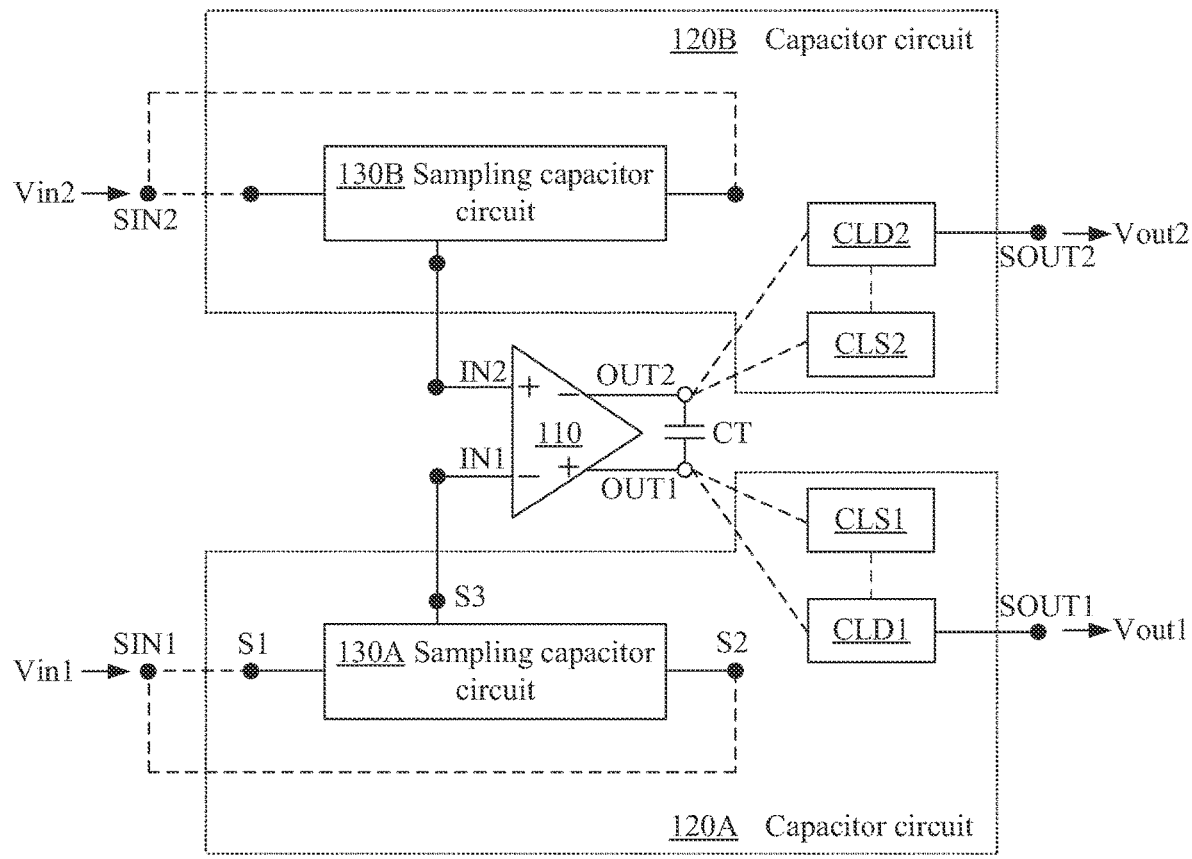
FIG. 1 illustrates a block diagram of a switched capacitor amplifier apparatus for improving level-shifting according to an embodiment of the present invention.

Reference is now made to FIG. 1. FIG. 1 illustrates a block diagram of a switched capacitor amplifier apparatus 100 for improving level-shifting according to an embodiment of the present invention. The switched capacitor amplifier apparatus 100 includes an amplifier 110, a capacitor circuit 120A, a capacitor circuit 120B and an electrical charge neutralizing capacitor CT.

In an embodiment, the amplifier 110 is an operational amplifier and includes an input terminal IN1, an input terminal IN2, an output terminal OUT1 and an output terminal OUT2. In an embodiment, the input terminal IN1 is an inverted input terminal and is labeled as a symbol of '-'. The input terminal IN2 is a non-inverted input terminal and is labeled as a symbol of '+'. The output terminal OUT1 is a non-inverted output terminal and is labeled as a symbol of '+'. The output terminal OUT2 is an inverted output terminal and is labeled as a symbol of '-'.

Each of the capacitor circuits 120A and 120B corresponds to one of the signal input terminals SIN1 and SIN2 and one of the signal output terminals SOUT1 and SOUT2.

The capacitor circuit 120A is configured to receive and amplify an input signal Vin1 from the signal input terminal SIN1, and outputs the amplified result through the signal output terminal SOUT1 to generate an output signal Vout1. The capacitor circuit 120A includes a sampling capacitor circuit 130A, a load capacitor CLD1 and a level-shifting capacitor CLS1.

The sampling capacitor circuit 130A of the capacitor circuit 120A is configured to receive and sample the input signal Vin1 from the signal input terminal SIN1 such that the sampled result is outputted through the sampling output terminal S3 to the input terminal IN1 of the amplifier 110 in a sampling period.

A plurality of connection relations are generated between both the load capacitor CLD1 and the level-shifting capacitor CLS1 and the output terminal OUT1 of the amplifier 110. In FIG. 1, dashed lines are used to show that these three components can be connected to each other with different configurations, in which the actual connection relations thereof are not shown. According to different connection relations, the load capacitor CLD1 and level-shifting capacitor CLS1 are charged according to an output from the output terminal OUT1 of the amplifier 110 in an estimation period, and the level-shifting capacitor CLS1 charges the load capacitor CLD1 subsequently in a level-shifting period to accomplish level-shifting such that the load capacitor CLD1 generates the output signal Vout1 at the signal output terminal SOUT1.

The capacitor circuit 120B includes a sampling capacitor circuit 130B, a load capacitor CLD2 and a level-shifting capacitor CLS2. The operation and the configuration of the capacitor circuit 120B are identical to those of the capacitor circuit 120A. The difference therebetween is that the capacitor circuit 120B receives and samples the input signal Vin2 from the signal input terminal SIN2, interacts with the input terminal IN2 and the output terminal OUT2 of the amplifier 110 and generates the output signal Vout2 through the signal output terminal SOUT2. The detail is therefore not described herein.

It is appreciated that the input signals Vin1 and Vin2 that the capacitor circuits 120A and 120B respective receive are differential signals, and the output signals Vout1 and Vout2 generated accordingly are also differential signals.

The electrical charge neutralizing capacitor CT is coupled between the two output terminals OUT1 and OUT2 of the amplifier 110. The electrical charge neutralizing capacitor CT is configured to receive electrical charges from the two output terminals OUT1 and OUT2 of the amplifier 110 in the estimation period and provide the electrical charges to the level-shifting capacitors CLS1 and CLS2 of the two capacitor circuits 120A and 120B in the level-shifting period.

Figure 2A:
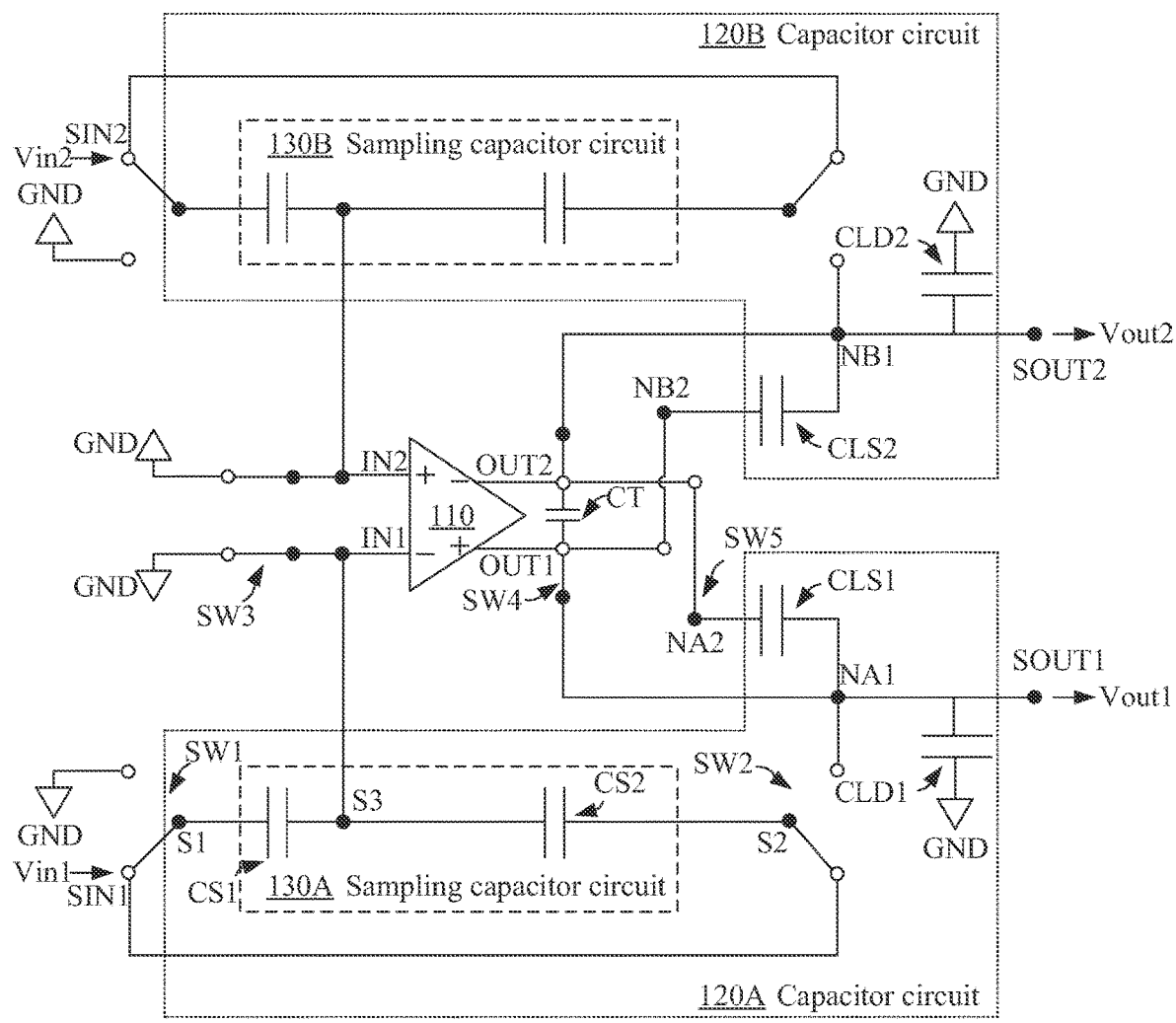
FIG. 2A to FIG. 2C illustrate circuit diagrams of the switched capacitor amplifier apparatus in different operation periods according to an embodiment of the present invention.
Figure 2B:
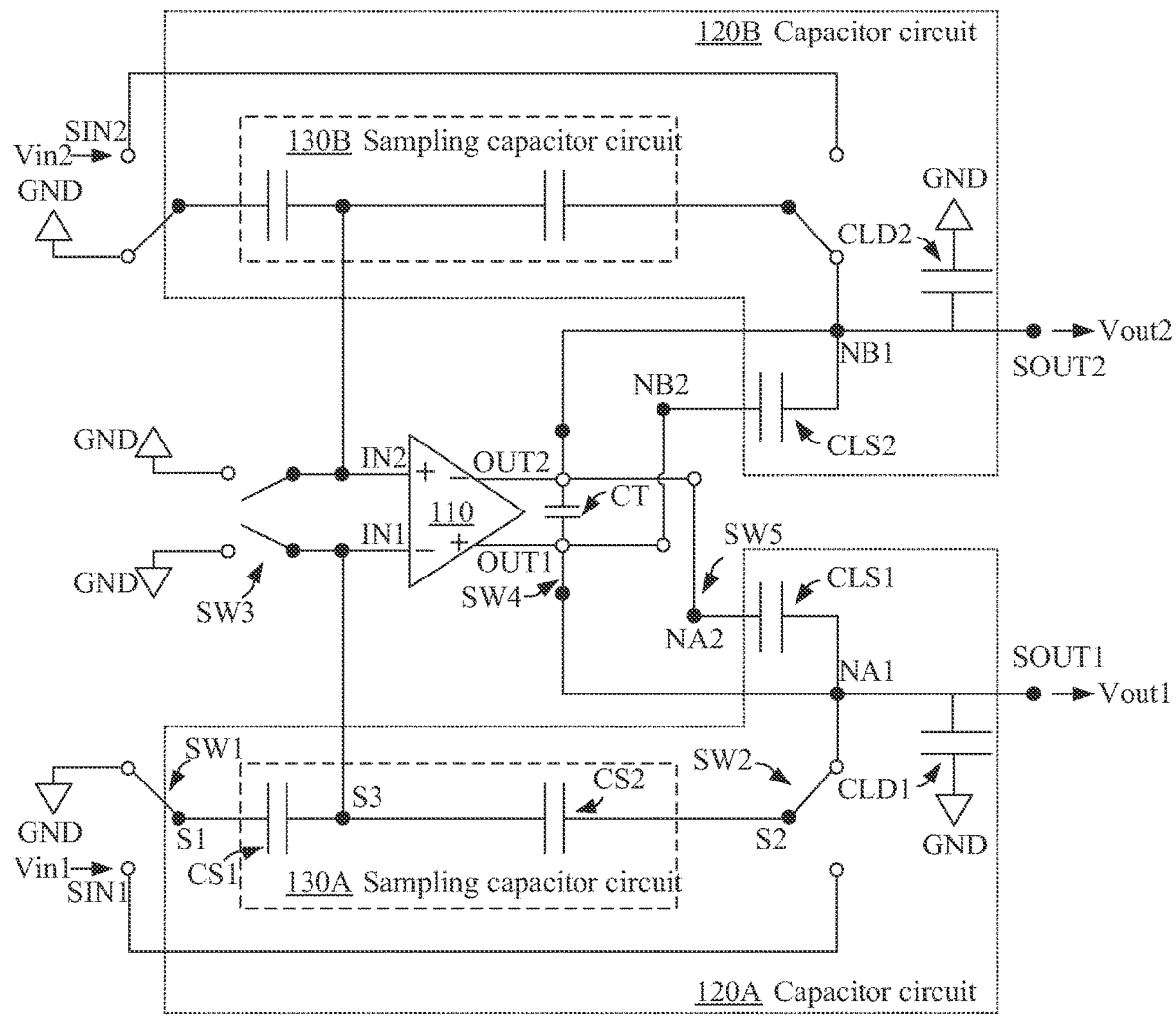
Figure 2C:
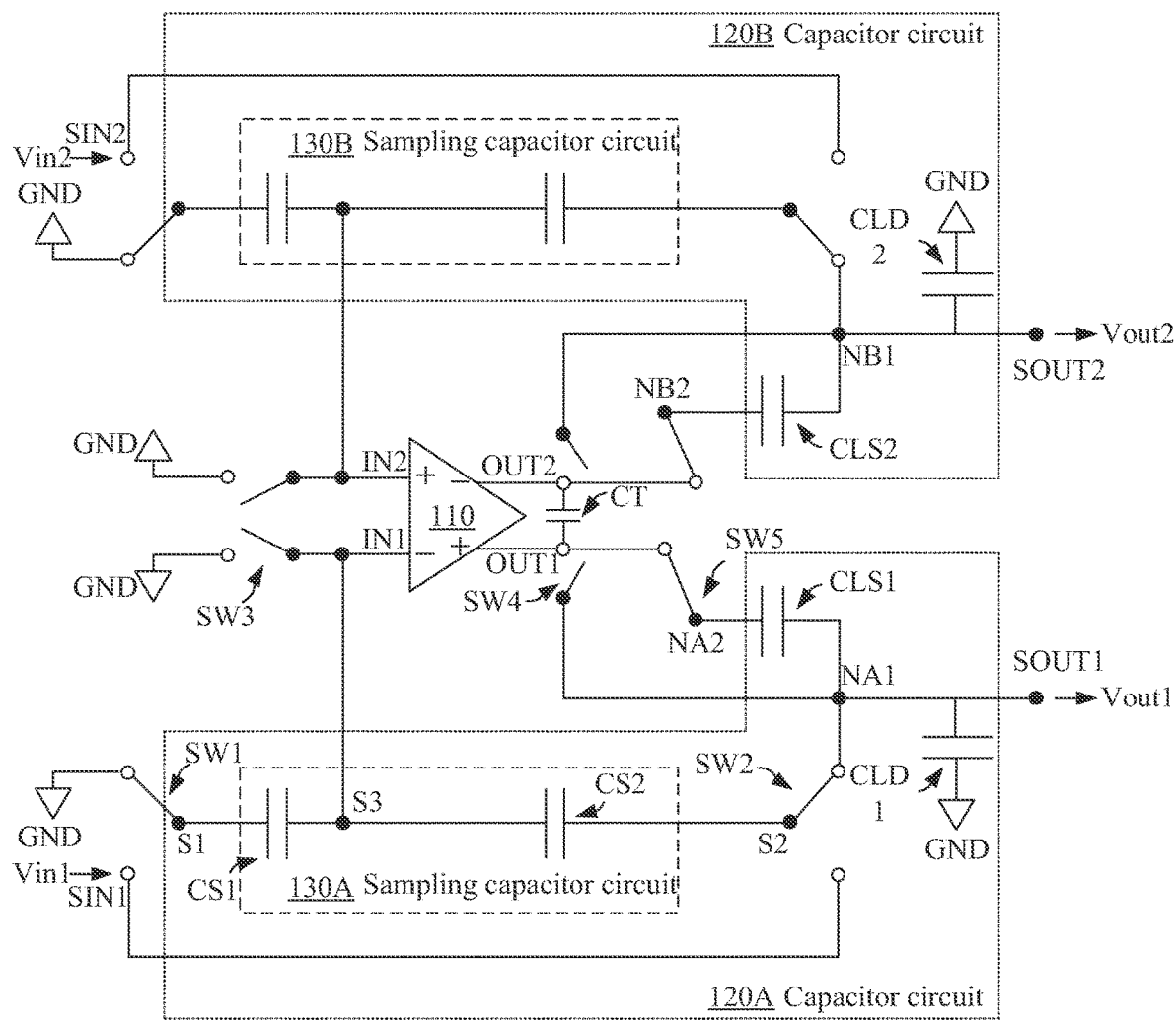

Reference is now made to FIG. 2A to FIG. 2C. FIG. 2A to FIG. 2C illustrate circuit diagrams of the switched capacitor amplifier apparatus 100 in different operation periods according to an embodiment of the present invention. The configuration and operation of the switched capacitor amplifier apparatus 100 are described in detail in the following paragraphs in accompany with FIG. 2A to FIG. 2C.

As illustrated in FIG. 2A, in an embodiment, the sampling capacitor circuit 130A of the capacitor circuit 120A actually includes a first sampling capacitor CS1 and a second sampling capacitor CS2. The first sampling capacitor CS1 is electrically coupled between a sampling input terminal S1 and a sampling output terminal S3. The second sampling capacitor CS2 is electrically coupled between a sampling input terminal S2 and a sampling output terminal S3.

The load capacitor CLD1 is electrically coupled between a first connection terminal NA1 and a ground terminal GND, in which the first connection terminal NA1 is further electrically coupled to the signal output terminal SOUT1. The level-shifting capacitor CLS1 is electrically coupled between the first connection terminal NA1 and a second connection terminal NA2.

Similarly, the sampling capacitor circuit 130B, the load capacitor CLD2 and the level-shifting capacitor CLS2 of the capacitor circuit 120B have the configuration same as the configuration of those in the capacitor circuit 120A. The detail is not described herein.

In the present embodiment, corresponding to the capacitor circuit 120A, the switched capacitor amplifier apparatus 100 includes a first switching unit SW1, a second switching unit SW2, a third switching unit SW3, a fourth switching unit SW4 and a fifth switching unit SW5. In different operation periods, different switching configurations of the first switching unit SW1 to the fifth switching unit SW5 of the switched capacitor amplifier apparatus 100 can be generated to allow the capacitor circuit 120A to receive the input signal Vin1 and generate the amplified output signal Vout1. In an embodiment, the switched capacitor amplifier apparatus 100 operates in a sampling period, an estimation period and a level-shifting period in series.

As illustrated in FIG. 2A that corresponds to the sampling period, for the capacitor circuit 120A, the first switching unit SW1 makes the sampling input terminal S1 electrically coupled to the signal input terminal SIN1, and the second switching unit SW2 also makes the sampling input terminal S2 electrically coupled to the signal input terminal SIN1. The third switching unit SW3 makes the sampling output terminal S1 and the input terminal IN1 of the amplifier 110 electrically coupled to the ground terminal GND. The fourth switching unit SW4 makes the first connection terminal NA1 electrically coupled to the output terminal OUT1 of the amplifier 110. The fifth switching unit SW5 makes the second connection terminal NA2 electrically coupled to output terminal OUT2.

Similarly, the capacitor circuit 120B can perform the same operation on the signal input terminal SIN2, the signal output terminal SOUT2, the input terminal IN2 of the amplifier 110 and the output terminal OUT2. However, for the capacitor circuit 120B, the second connection terminal NB2 that the level-shifting capacitor CLS2 corresponds to is electrically coupled to output terminal OUT1. Other description about the configuration and the operation of the capacitor circuit 120B is not further made herein.

As a result, in the sampling period, the sampling capacitor circuits 130A and 130B respectively receives the input signals Vin1 and Vin2 from the corresponding sampling input terminals S1 and S2 to sample the input signals Vin1 and Vin2.

As illustrated in FIG. 2B that corresponds to the estimation period, for the capacitor circuit 120A, the first switching unit SW1 makes the sampling input terminals S1 electrically coupled to the ground terminal GND. The second switching unit SW2 makes the sampling input terminals S2 electrically coupled to first connection terminal NA1. The third switching unit SW3 makes the sampling output terminal S1 and the input terminal IN1 of the amplifier 110 electrically isolated from the ground terminal GND. The fourth switching unit SW4 makes the first connection terminal NA1 electrically coupled to the output terminal OUT1 of the amplifier 110. The fifth switching unit SW5 makes the second connection terminal NA2 electrically coupled to the output terminal OUT2.

Similarly, the capacitor circuit 120B can perform the same operation on the signal input terminal SIN2, the signal output terminal SOUT2, the input terminal IN2 of the amplifier 110 and the output terminal OUT2. However, for the capacitor circuit 120B, the second connection terminal NB2 that the level-shifting capacitor CLS2 corresponds to is electrically coupled to the output terminal OUT1. Other description about the configuration and the operation of the capacitor circuit 120B is not further made herein.

As a result, in the estimation period, the sampling capacitor circuits 130A and 130B respectively output the sampled input signals Vin1 and Vin2 through the sampling output terminal S1 to the input terminals IN1 and IN2 of the amplifier 110. Further, the load capacitors CLD1 and CLD2 and the level-shifting capacitors CLS1 and CLS2 are charged according to the outputs of the output terminals OUT1 and OUT2 of the amplifier 110. Under such a condition, the operation of the load capacitors CLD1 and CLD2 makes the voltages of the signal output terminals SOUT1 and SOUT2 increase.

At the same time, since the electrical charge neutralizing capacitor CT is coupled between the two output terminals OUT1 and OUT2 of the amplifier 110, the electrical charge neutralizing capacitor CT receives electrical charges according to the output of the output terminal OUT1 of the amplifier 110.

As illustrated in FIG. 2C that corresponds to the level-shifting period, for the capacitor circuit 120A, the first switching unit SW1 makes the sampling input terminals S1 electrically coupled to the ground terminal GND. The second switching unit SW2 makes the sampling input terminals S2 electrically coupled to the first connection terminal NA1. The third switching unit SW3 makes the sampling output terminal S1 and the input terminal IN1 of the amplifier 110 electrically isolated from the ground terminal GND. The fourth switching unit SW4 makes the first connection terminal NA1 and the output terminal OUT1 of the amplifier 110 electrically isolated from each other. The fifth switching unit SW5 makes the second connection terminal NA2 electrically coupled to the output terminal OUT1 of the amplifier 110.

Similarly, the capacitor circuit 120B can perform the same operation on the signal input terminal SIN2, the signal output terminal SOUT2, the input terminal IN2 of the amplifier 110 and the output terminal OUT2. However, for the capacitor circuit 120B, the second connection terminal NB2 that the level-shifting capacitor CLS2 corresponds to is electrically coupled to the output terminal OUT2. Other description about the configuration and the operation of the capacitor circuit 120B is not further made herein.

As a result, in the level-shifting period, the level-shifting capacitors CLS1 and CLS2 charge the load capacitors CLD1 and CLD2. Under such a condition, the operation of the load capacitors CLD1 and CLD2 make the voltages of the signal output terminals SOUT1 and SOUT2 increase again to accomplish level-shifting so as to generate the output signals Vout1 and Vout2 at the signal output terminals SOUT1 and SOUT2.

Figure 3A:
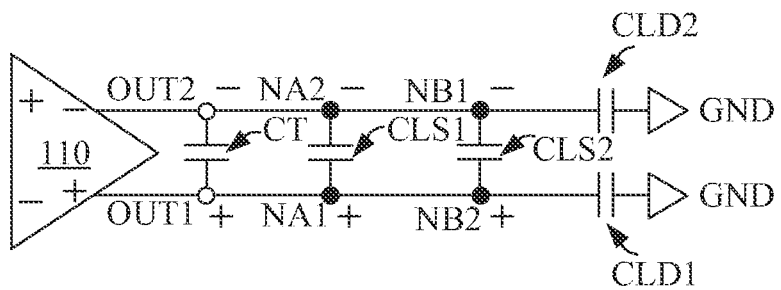
FIG. 3A illustrates a simplified circuit diagram of the amplifier, the load capacitors, the level-shifting capacitors and the electrical charge neutralizing capacitor in the estimation period according to an embodiment of the present invention.
Figure 3B:
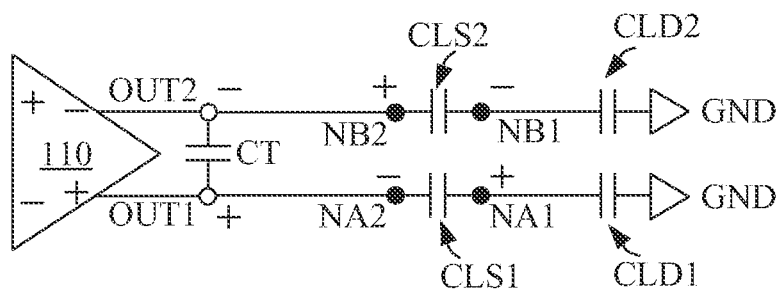
FIG. 3B illustrates a simplified circuit diagram of the amplifier, the load capacitors, the level-shifting capacitors and the electrical charge neutralizing capacitor in an initial section in the level-shifting period according to an embodiment of the present invention.
Figure 3C:
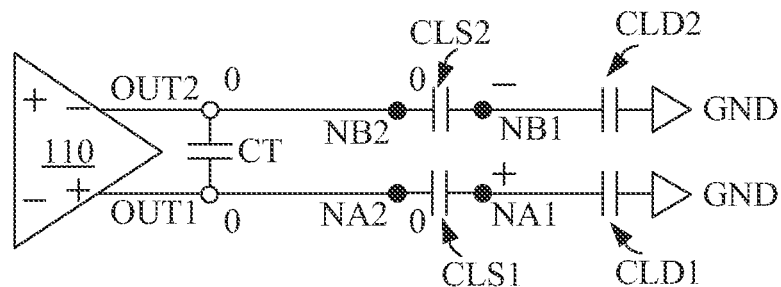
FIG. 3C illustrates a simplified circuit diagram of the amplifier, the load capacitors, the level-shifting capacitors and the electrical charge neutralizing capacitor after the initial section in the level-shifting period according to an embodiment of the present invention.

Reference is now made to FIG. 3A to FIG. 3C at the same time. FIG. 3A illustrates a simplified circuit diagram of the amplifier 110, the load capacitors CLD1 and CLD2, the level-shifting capacitors CLS1 and CLS2 and the electrical charge neutralizing capacitor CT in the estimation period according to an embodiment of the present invention. FIG. 3B illustrates a simplified circuit diagram of the amplifier 110, the load capacitors CLD1 and CLD2, the level-shifting capacitors CLS1 and CLS2 and the electrical charge neutralizing capacitor CT in an initial section in the level-shifting period according to an embodiment of the present invention. FIG. 3C illustrates a simplified circuit diagram of the amplifier 110, the load capacitors CLD1 and CLD2, the level-shifting capacitors CLS1 and CLS2 and the electrical charge neutralizing capacitor CT after the initial section in the level-shifting period according to an embodiment of the present invention.

As illustrated in FIG. 3A, in the estimation period, since the output terminal OUT1 is the non-inverted output terminal, the output terminal OUT1 outputs a positive voltage relative to a reference voltage level to a corresponding terminal of the electrical charge neutralizing capacitor CT, the corresponding load capacitor CLD1, the first connection terminal NA1 corresponding to the level-shifting capacitor CLS1 and the second connection terminal NB2 corresponding to the level-shifting capacitor CLS2. A symbol '+' is labeled at each of these terminals in FIG. 3A.

Since the output terminal OUT2 is an inverted output terminal, the output terminal OUT2 outputs a negative voltage relative to the reference voltage level to the other corresponding terminal of the electrical charge neutralizing capacitor CT, the corresponding load capacitor CLD2, the second connection terminal NA2 corresponding to the level-shifting capacitor CLS1 and the first connection terminal NB1 corresponding to the level-shifting capacitor CLS2. A symbol '−' is labeled at each of these terminals in FIG. 3A.

On the other hand, as illustrated in FIG. 3B, in the level-shifting period, the level-shifting capacitor CLS1 corresponding to the non-inverted output terminal OUT1 outputs a positive voltage based on the charging activity described above, so as to make the voltage of the first connection terminal NA1 that the level-shifting capacitor CLS1 corresponds to increase in the initial section of the level-shifting period, and make the voltage of the second connection terminal NA2 decrease. In FIG. 3B, a symbol '+' is labeled at the terminal having the voltage increased and a symbol '-' is labeled at the terminal having the voltage decreased described above.

The level-shifting capacitor CLS2 corresponding to the inverted output terminal OUT2 outputs a negative voltage so as to make the voltage of the first connection terminal NB1 that the level-shifting capacitor CLS2 corresponds to decrease (increase in a negative way) in the initial section of the level-shifting period, and make the voltage of the second connection terminal NB2 increase (decrease in a negative way). In FIG. 3B, a symbol '−' is labeled at the terminal having the voltage decreased and a symbol '+' is labeled at the terminal having the voltage increased inscribed above.

Under such a condition, the electrical charge neutralizing capacitor CT coupled between the two output terminals OUT1 and OUT2 of the amplifier 110 provides electrical charges. More specifically, the electrical charge neutralizing capacitor CT provides positive electrical charges to the second connection terminal NA2 of the capacitor circuit 120A to perform charge-neutralizing, and provides negative electrical charges to the second connection terminal NB2 of the capacitor circuit 120B to perform charge-neutralizing. As illustrated in FIG. 3C, after the initial section in the level-shifting period, the voltages of the output terminals OUT1 and OUT2 and the second connection terminals NA2 and NB2 that the level-shifting capacitors CLS1 and CLS2 correspond to becomes stable due to the charge-neutralizing. A symbol '0' is labeled at the terminals described above in FIG. 3C.

Since in the level-shifting period, the level-shifting capacitors CLS1 and CLS2 need to not only charge the load capacitors CLD1 and CLD2, but also to charge the sampling capacitor circuits 130A and 130B that the first connection terminals NA1 and NB1 are electrically coupled to, the current input and output ability of the amplifier 110 at the two output terminals OUT1 and OUT2 affects the charging ability of the level-shifting capacitors CLS1 and CLS2. However, under the condition that the amplifier 110 does not have a quick response, the charging ability of the level-shifting capacitors CLS1 and CLS2 decreases.

As a result, by disposing the electrical charge neutralizing capacitor CT, the amplifier 110 can store the electrical charges in the electrical charge neutralizing capacitor CT in advance in the estimation period such that the electrical charge neutralizing capacitor CT provides electrical charges in the level-shifting period to compensate the insufficient current providing ability of the amplifier 110.

In an embodiment, take the capacitor circuit 120A as an example, the electrical charge neutralizing capacitor CT, corresponding to the second connection terminal NA2, has a first voltage with a value of V1 after receiving the electrical charges, the second connection terminal NA2 has a second voltage with a value of V2 in the initial section of the level-shifting period, the load capacitor CLD1 and the level-shifting capacitor CLS1 have an equivalent capacitance with a value of Ce, a target voltage value of the second connection terminal NA2 is Vt, and a capacitance of the electrical charge neutralizing capacitor CT is Ct to perform charge neutralizing. According to the equation that multiplies the voltage value and the capacitance value to obtain the electrical charges amount, the following equation can be generated:

$$2Ct \times V1 + Ce \times V2 = Vt \times (2Ct + Ce) \quad \text{(Equation 1)}$$

As a result, Ct becomes:

$$Ct = (Ce \times (Vt - V2))/(2 \times (V1 - Vt)) \quad \text{(Equation 2)}$$

In a numerical example, the first voltage V1 is 0.6, the second voltage V2 is 0.4, the equivalent capacitance Ce is C and the target voltage value Vt is 0.5. Based on the Equation 2, the capacitance Ct of the electrical charge neutralizing capacitor CT is 0.5C.

In an embodiment, each of the level-shifting capacitors CLS1 and CLS2 and the electrical charge neutralizing capacitor Ct is a variable capacitor. A capacitance of each of the level-shifting capacitors CLS1 and CLS2 and the electrical charge neutralizing capacitor Ct is varied according to a direct current gain of the amplifier 110.

More specifically, in some usage scenarios, the direct current gain of the amplifier 110 may be affected by temperature, pressure or manufacturing process and vary for a several dozen decibels (dBs). As a result, by disposing each of the level-shifting capacitors CLS1 and CLS2 and the electrical charge neutralizing capacitor Ct implemented by a variable capacitor, the capacitance of each of the level-shifting capacitors CLS1 and CLS2 and the electrical charge neutralizing capacitor Ct can be varied under the control of other circuits (not illustrated in the figure) according to direct current gain of the amplifier 110, so as to maintain the loop gain between the output signals Vout1 and Vout2 and the input signals Vin1 and Vin2.

Reference is now made to FIG. 4. FIG. 4 illustrates a voltage waveform diagram of the output terminal OUT1 of the amplifier 110 in the level-shifting period according to an embodiment of the present invention. In FIG. 4, the X-axis represents the time and the Y-axis represents the voltage. The time section T1 corresponds to the estimation period, the time section T2 corresponds to the level-shifting period. Further, the dashed line corresponds to a first condition that the electrical charge neutralizing capacitor CT is absent between the output terminals OUT1 and OUT2 of the amplifier 110. The solid line corresponds to a second condition that the electrical charge neutralizing capacitor CT is presented between the output terminals OUT1 and OUT2 of the amplifier 110.

As illustrated in FIG. 4, in comparison to the first condition, though the voltage increases in a slower manner in the estimation period of the second condition due to the addition electrical charges supplied to the electrical charge neutralizing capacitor CT, the impulse of the voltage is much smaller and the voltage quickly becomes stable in the level-shifting period due to the presence of the electrical charge neutralizing capacitor CT.

As a result, the switched capacitor amplifier apparatus 100 for improving level-shifting in the present invention can compensate the current supplying ability of the amplifier 110 in the level-shifting period by disposing the electrical charge neutralizing capacitor CT such that the voltages of the level-shifting capacitors CLS1 and CLS2 quickly become stable to improve the speed of level-shifting.

It is appreciated that the configuration of the switched capacitor amplifier apparatus 100 in FIG. 2A to FIG. 2C is merely an example. In different usage scenarios, the switched capacitor amplifier apparatus 100 can be implemented by other configurations and is not limited to the configuration illustrated in FIG. 2A to FIG. 2C.

Reference is now made to FIG. 5. FIG. 5 illustrates a flow chart of a switched capacitor amplifying method 500 for improving level-shifting according to an embodiment of the present invention.

Besides the apparatus described above, the present invention further discloses the switched capacitor amplifying method 500 that can be used in such as, but not limited to the switched capacitor amplifier apparatus 100 illustrated in FIG. 1. An embodiment of the switched capacitor amplifying method 500 is illustrated in FIG. 5 and includes the steps outlined below.

In step S510, one of the two input signals Vin1 and Vin2 is sampled from one of the two signal input terminals SIN1 and SIN2 and outputted to one of the two input terminals SIN1 and SIN2 of the amplifier 110 in the sampling period by the sampling capacitor circuits 130A and 130B of each of two capacitor circuits 120A and 120B.

In step S520, the connection relations between both of the load capacitors CLD1 and CLD2 and the level-shifting capacitors CLS1 and CLS2 of one of the two capacitor circuits 120A and 120B and one of two output terminals OUT1 and OUT2 of the amplifier 110 are generated, such that the load capacitors CLD1 and CLD2 and the level-shifting capacitors CLS1 and CLS2 are charged according to an output from one of the two output terminals OUT1 and OUT2 of the amplifier 110 in the estimation period and the level-shifting capacitors CLS1 and CLS2 charge the load capacitors CLD1 and CLD2 in the level-shifting period to accomplish level-shifting such that the load capacitors CLD1 and CLD2 generate one of two output signals Vout1 and Vout2 at one of two signal output terminals SOUT1 and SOUT2.

In step S530, the electrical charges are received from the two output terminals OUT1 and OUT2 of the amplifier 110 in the estimation period and the electrical charges are provided to the level-shifting capacitors CLS1 and CLS2 of each of the two capacitor circuits 120A and 120B in the level-shifting period by the electrical charge neutralizing capacitor Ct coupled between the two output terminals OUT1 and OUT2 of the amplifier 110.

It is appreciated that the embodiments described above are merely an example. In other embodiments, it is appreciated that many modifications and changes may be made by those of ordinary skill in the art without departing, from the spirit of the invention.

In summary, the switched capacitor amplifier apparatus and the switched capacitor amplifying method for improving level-shifting of the present invention can compensate the current supplying ability of the amplifier in the level-shifting period by disposing the electrical charge neutralizing capacitor such that the voltages of the level-shifting capacitors quickly become stable to improve the speed of level-shifting.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A switched capacitor amplifier apparatus for improving level-shifting comprising:
an amplifier comprising two input terminals and two output terminals;
two capacitor circuits each corresponding to one of two signal input terminals and one of two signal output terminals and each comprises a sampling capacitor circuit, a load capacitor and a level-shifting capacitor, wherein the sampling capacitor circuit is configured to sample and output one of two input signals from one of the two signal input terminals to one of the two input terminals of the amplifier in a sampling period; and
an electrical charge neutralizing capacitor coupled between the two output terminals of the amplifier;
wherein a plurality of connection relations are generated between both the load capacitor and the level-shifting capacitor and one of the two output terminals of the amplifier, such that the load capacitor and the level-shifting capacitor are charged according to an output from one of the two output terminals of the amplifier in an estimation period and the level-shifting capacitor charges the load capacitor in a level-shifting period to accomplish level-shifting such that the load capacitor generates one of two output signals at one of the two signal output terminals;
wherein the electrical charge neutralizing capacitor is configured to receive electrical charges from the two output terminals of the amplifier in the estimation period and provide the electrical charges to the level-shifting capacitor of each of the two capacitor circuits in the level-shifting period.

2. The switched capacitor amplifier apparatus of claim 1, wherein the load capacitor is electrically coupled between a first connection terminal and a ground terminal, the level-shifting capacitor is electrically coupled between the first connection terminal and a second connection terminal, and the first connection terminal is further electrically coupled to one of the two signal output terminals;
in the sampling period, the first connection terminal is electrically coupled to one of the two output terminals of the amplifier, the second connection terminal is grounded, and each of two sampling input terminals of the sampling capacitor circuit is only electrically coupled to one of the two signal input terminals to receive and sample one of the two input signals, and a sampling output terminal of the sampling capacitor circuit is electrically coupled to one of the two input terminals of the amplifier and is grounded at the same time;
in the estimation period, each of the first connection terminal and the second connection terminal is electrically coupled to one of the two output terminals of the amplifier, a first one of the two sampling input terminals of the sampling capacitor circuit is grounded and a second one of the two sampling input terminals of the sampling capacitor circuit is electrically coupled to the first connection terminal, and the sampling output terminal is electrically coupled to one of the input terminals of the amplifier and is not grounded so as to feed the sampled one of the input signals to one of the two input terminals such that the amplifier charges the load capacitor and the level-shifting capacitor through one of the two output terminals and the first connection terminal; and
in the level-shifting period, the first one of the two sampling input terminals of the sampling capacitor circuit is grounded and the second one of the two sampling input terminals of the sampling capacitor circuit is electrically coupled to the first connection terminal, the sampling output terminal is electrically coupled to one of the two input terminals of the amplifier and is not grounded, the first connection terminal is not electrically coupled to one of the two of the output terminals of the amplifier, and the second connection terminal is electrically coupled to one of the two output terminals of the amplifier such that the level-shifting capacitor charges the load capacitor.

3. The switched capacitor amplifier apparatus of claim 2, wherein the electrical charge neutralizing capacitor is configured to perform charge-neutralizing on the level-shifting capacitor of each of the two capacitor circuits through the second connection terminal by providing the electrical charges in the level-shifting period.

4. The switched capacitor amplifier apparatus of claim 3, wherein the electrical charge neutralizing capacitor, corresponding to the second connection terminal, has a first voltage with a value of V1 after receiving the electrical charges, the second connection terminal has a second voltage with a value of V2 in an initial section of the level-shifting period, the load capacitor and the level-shifting capacitor have an equivalent capacitance with a value of Ce, a target voltage value of the second connection terminal is Vt, and a capacitance of the electrical charge neutralizing capacitor is Ct to perform charge neutralizing;

wherein $$2Ct \times V1 + Ce \times V2 = Vt \times (2Ct + Ce).$$

5. The switched capacitor amplifier apparatus of claim 1, wherein each of the level-shifting capacitor and the electrical charge neutralizing capacitor is a variable capacitor, and a capacitance of each of the level-shifting capacitor and the electrical charge neutralizing capacitor is varied according to a direct current gain of the amplifier.

6. A switched capacitor amplifying method for improving level-shifting used in a switched capacitor amplifier apparatus, comprising:
   sampling and outputting one of two input signals from one of two signal input terminals to one of two input terminals of an amplifier in a sampling period by a sampling capacitor circuit of one of two capacitor circuits;
   generating a plurality of connection relations between both a load capacitor and a level-shifting capacitor of one of the two capacitor circuits and one of two output terminals of the amplifier such that the load capacitor and the level-shifting capacitor are charged according to an output from one of the two output terminals of the amplifier in an estimation period and the level-shifting capacitor charges the load capacitor in a level-shifting period to accomplish level-shifting such that the load capacitor generates one of two output signals at one of two signal output terminals; and
   receiving electrical charges from the two output terminals of the amplifier in the estimation period and providing the electrical charges to the level-shifting capacitor of each of the two capacitor circuits in the level-shifting period by an electrical charge neutralizing capacitor coupled between the two output terminals of the amplifier.

7. The switched capacitor amplifying method of claim 6, wherein the load capacitor is electrically coupled between a first connection terminal and a ground terminal, the level-shifting capacitor is electrically coupled between the first connection terminal and a second connection terminal, and the first connection terminal is further electrically coupled to one of the two signal output terminals;
   in the sampling period, the first connection terminal is electrically coupled to one of the two output terminals of the amplifier, the second connection terminal is grounded, and each of two sampling input terminals of the sampling capacitor circuit is only electrically coupled to one of the two signal input terminals to receive and sample one of the two input signals, and a sampling output terminal of the sampling capacitor circuit is electrically coupled to one of the two input terminals of the amplifier and is grounded at the same time;
   in the estimation period, each of the first connection terminal and the second connection terminal is electrically coupled to one of the two output terminals of the amplifier, a first one of the two sampling input terminals of the sampling capacitor circuit is grounded and a second one of the two sampling input terminals of the sampling capacitor circuit is electrically coupled to the first connection terminal, and the sampling output terminal is electrically coupled to one of the input terminals of the amplifier and is not grounded so as to feed the sampled one of the input signals to one of the two input terminals such that the amplifier charges the load capacitor and the level-shifting capacitor through one of the two output terminals and the first connection terminal; and
   in the level-shifting period, the first one of the two sampling input terminals of the sampling capacitor circuit is grounded and the second one of the two sampling input terminals of the sampling capacitor circuit is electrically coupled to the first connection terminal, the sampling output terminal is electrically coupled to one of the two input terminals of the amplifier and is not grounded, the first connection terminal is not electrically coupled to one of the two of the output terminals of the amplifier, and the second connection terminal is electrically coupled to one of the two output terminals of the amplifier such that the level-shifting capacitor charges the load capacitor.

8. The switched capacitor amplifying method of claim 7, further comprising:
   performing charge-neutralizing on the level-shifting capacitor of each of the two capacitor circuits by the electrical charge neutralizing capacitor through the second connection terminal by providing the electrical charges in the level-shifting period.

9. The switched capacitor amplifying method of claim 8, wherein the electrical charge neutralizing capacitor, corresponding to the second connection terminal, has a first voltage with a value of V1 after receiving the electrical charges, the second connection terminal has a second voltage with a value of V2 in an initial section of the level-shifting period, the load capacitor and the level-shifting capacitor have an equivalent capacitance with a value of Ce, a target voltage value of the second connection terminal is Vt, and a capacitance of the electrical charge neutralizing capacitor is Ct to perform charge neutralizing;
wherein $$2Ct \times V1 + Ce \times V2 = Vt \times (2Ct + Ce).$$

10. The switched capacitor amplifying method of claim 6, wherein each of the level-shifting capacitor and the electrical charge neutralizing capacitor is a variable capacitor, and a capacitance of each of the level-shifting capacitor and the electrical charge neutralizing capacitor is varied according to a direct current gain of the amplifier.

* * * * *